United States Patent
Fischer et al.

(10) Patent No.: US 7,049,958 B2
(45) Date of Patent: May 23, 2006

(54) INTEGRATED CIRCUIT FOR A TRANSPONDER

(75) Inventors: Martin Fischer, Gleichen (DE); Ulrich Friedrich, Ellhofen (DE)

(73) Assignee: Atmel Germany GmbH, Heilbronn (DE)

( * ) Notice: Subject to any disclaimer, the term of this patent is extended or adjusted under 35 U.S.C. 154(b) by 114 days.

(21) Appl. No.: 10/849,086

(22) Filed: May 18, 2004

(65) Prior Publication Data

US 2004/0245344 A1 Dec. 9, 2004

(30) Foreign Application Priority Data

May 21, 2003 (DE) ................. 103 22 888

(51) Int. Cl.
*G08B 1/08* (2006.01)
(52) U.S. Cl. ............................ 340/539.17; 340/539.1; 340/505; 340/572.1; 340/572.4; 340/10.1; 340/10.3; 235/491
(58) Field of Classification Search .......... 340/539.17, 340/539.1, 505, 551, 572.1, 572.4, 10.1, 340/10.3, 10.4, 10.42; 235/491, 492, 451
See application file for complete search history.

(56) References Cited

U.S. PATENT DOCUMENTS 5,153,583 A * 10/1992 Murdoch ................. 340/10.34
6,809,952 B1 * 10/2004 Masui ........................ 365/145

* cited by examiner

*Primary Examiner*—Hung Nguyen
(74) *Attorney, Agent, or Firm*—W. F. Fasse; W. G. Fasse

(57) ABSTRACT

An integrated circuit is combined with a transponder to function either as a voltage or power supply for the transponder by extracting energy out of an electromagnetic field transmitted by a base station or as a detector in the transponder to act as a remote sensor. For this purpose the integrated circuit comprises diode rectifiers. Each of the diode rectifiers has a first and a second service terminal and a reference terminal. In order to reduce a parasitic impedance between the first service terminal and the reference terminal, the first service terminal of at least one rectifier diode is electrically connected to a reference potential such as ground. Parasitic diode characteristics are further reduced by surrounding the respective diode or diodes by an electrical conductor path also connected to the reference potential.

21 Claims, 5 Drawing Sheets

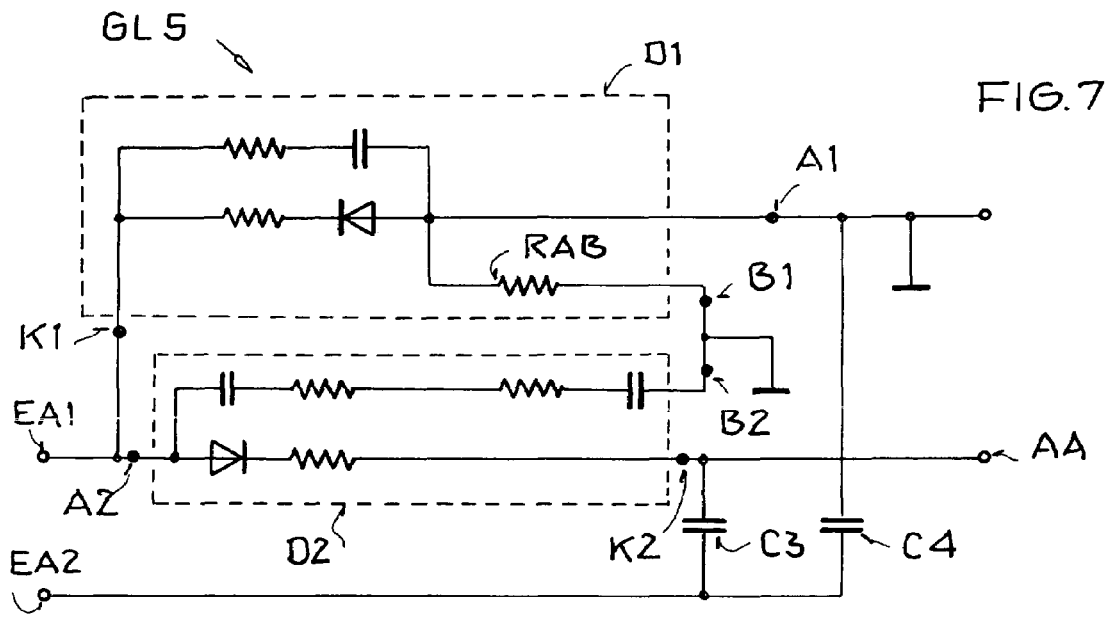
FIG. 7
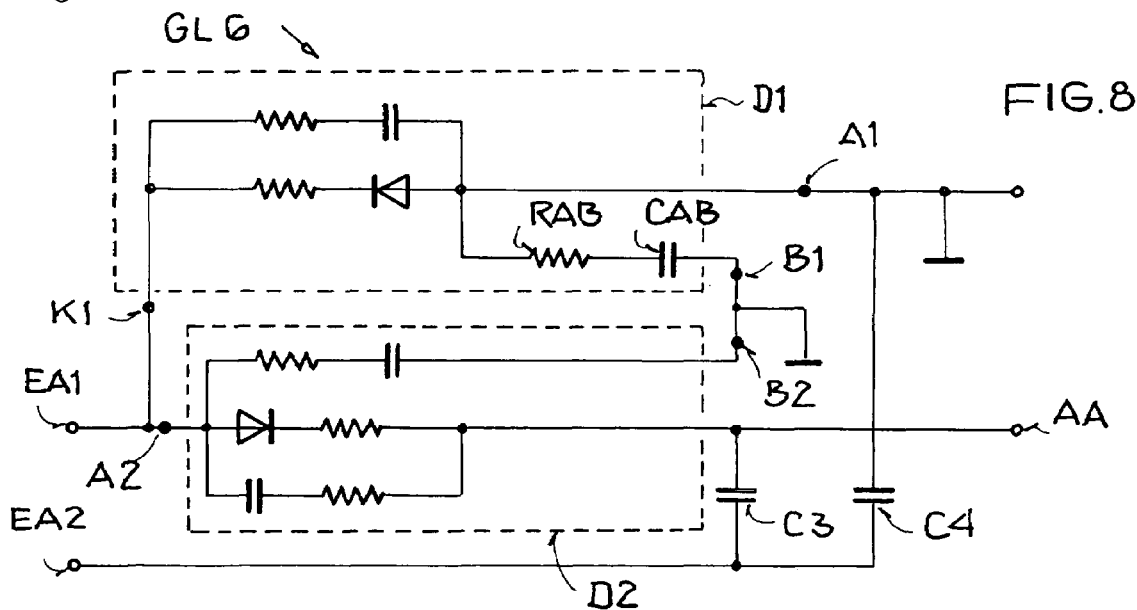
FIG. 8
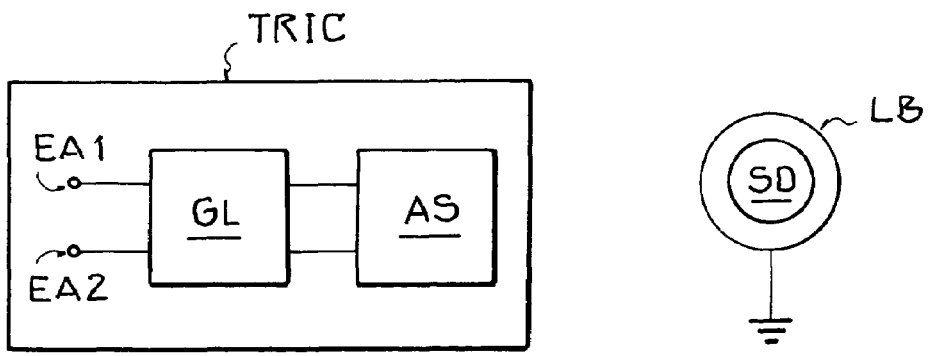
FIG. 9
FIG. 10

US 7,049,958 B2

INTEGRATED CIRCUIT FOR A TRANSPONDER

PRIORITY CLAIM

This application is based on and claims the priority under 35 U.S.C. §119 of German Patent Application 103 22 888.8, filed on May 21, 2003, the entire disclosure of which is incorporated herein by reference.

FIELD OF THE INVENTION

The invention relates to an integrated circuit particularly constructed for use in a transponder. Such transponders transmit data in so-called radio frequency identification systems (RFID systems).

BACKGROUND INFORMATION

Integrated circuits are used in transponders that are either passive transponders or semi-passive transponders or back-scattering transponders. Any transponder of these types can comprise one or more rectifiers that function as a power supply or as a detector. The transponders function as so-called contactless or wireless identification systems or as radio frequency identification systems in which the transmissions take place between one or several base stations or rather reading devices and one or several transponders. These transmissions transmit data in a wireless or contactless manner. The integrated circuits may comprise sensors, for example for measuring temperatures, whereby the transponders function as so-called remote sensors.

The transponder or rather its transmitter receiver sections normally do not comprise an active transmitter for the data transmission to a base station. These systems are referred to as inactive systems or as passive systems if they have no power supply of their own, or as semi-passive systems if they have their own power supply. In those instances where the data transmissions take place over distances clearly larger than 1 m and the wireless transmission takes place with ultra high frequencies or microwaves the transponder functions, as a rule as a so-called back-scatter or as a so-called back-scatter coupled device. For this purpose the base station emits electromagnetic carrier waves. These waves are modulated in the transponder, specifically in the transmitter and receiver portion of the transponder in accordance with the data to be transmitted to the base station and then reflected back to the base station. This modulation is performed normally by a variation of the input impedance of the receiver/transmitter portion of the transponder which causes a variation of the reflection characteristics of an antenna connected to the transponder.

Ever increasing demands are made on the transmission range of such transponders. In connection with passive transponders or remote sensors, the energy required to operate these devices is extracted from the electromagnetic field with the aid of an antenna as the field is emitted by the base station. For this purpose the rectifier is connected to the antenna for generating and operating voltage. The rectifier is conventionally constructed as a single stage or multi-stage voltage doubling circuit which contains rectifier diodes for performing the rectifying function. These diodes are generally Schottky-diodes when the rectifier functions in the operating frequency ranges in the UHF range or higher.

In the integrated circuit these Schottky-diodes comprise a reference potential terminal for connection to a reference potential, for example in connection with a CMOS operation or process. Additionally, these Schottky diodes comprise a first service terminal and a second service terminal, whereby the diode path is formed between the first and the second service terminals while a parasitic impedance exists between the reference terminal and the first service terminal.

The parasitic impedance, particularly its real component determined by the ohmic components, reduces the efficiency or effectiveness of the rectifier circuit because a substantial proportion of the received power is dissipated, among others, in the ohmic impedance portions. Furthermore, the parasitic impedance has generally a very disadvantageous Q-value due to the Ohmic impedance components. Thus, a mismatch is hard to reduce or eliminate even if matching networks are used.

OBJECTS OF THE INVENTION

In view of the foregoing it is the aim of the invention to achieve the following objects singly or in combination:

to provide an integrated circuit for a transponder of the type described above which circuit has a substantially improved transmission and receiving range for the data transmission between a base station and the transponder;

to realize such an integrated circuit with a relatively small effort and expense;

to increase the efficiency of the rectifier in the integrated circuit by reducing the above-mentioned parasitic impedances; and to adapt Schottky-diodes in their structure for the present purposes, particularly by further reducing parasitic characteristics of such modified Schottky-diodes.

SUMMARY OF THE INVENTION

The above objects have been achieved according to the present invention by an integrated circuit, comprising a transponder, a rectifier including rectifier diodes, each of said rectifier diodes comprising a reference terminal for connection to a reference potential, a first service terminal and a second service terminal, a diode path between said first and second service terminals, a parasitic impedance between said first service terminal and said reference terminal, and an electrical connection between said reference potential and said first service terminal of at least one rectifier diode of said rectifier diodes for reducing said parasitic impedance.

Thus, according to the invention that service terminal of at least one rectifier diode which has the parasitic impedance relative to its reference terminal, is connected to the reference potential to which the reference terminal of the diode is also connected. This feature of the invention reduces the sum of all parasitic impedances in the input circuits because the parasitic impedance between the respective service terminal and the reference terminal is short-circuited according to the invention. Due to the reduced parasitic impedances the efficiency of the rectifier is increased which in turn increases the transmission range between a base station and the transponder. Typically Schottky-diodes are used for the rectifier diodes. However, any desirable other diodes can be used, such as semiconductor structures functioning as diodes, for example field-effect transistors wired as diodes or bi-polar transistors wired as diodes.

By using ground potential as the reference potential, the invention achieves the advantage of a very simple circuit layout because ground potential is generally available at many locations within the integrated circuit.

In order to modify Schottky diodes for the present purposes, a semiconductor substrate is provided with at least one doped trough region. The first service terminal of the rectifier diode is formed in a rim or margin area of the doped trough region. The second service terminal of the rectifier diode is formed on the surface of the doped trough region as a metal-to-semiconductor transition. A spacing is provided between the first service terminal and the second service terminal. The reference potential terminal is formed on the surface of the semiconductor substrate outside of the doped trough region, but neighboring that region. These modifications of Schottky diodes according to the invention are easily producible by simple known process steps.

The above mentioned short-circuiting of the parasitic impedance between the first service terminal and the reference potential can be achieved according to the invention, for example by realizing the rectifier in a Villard-circuit which may be a single stage or a multi-stage circuit. Preferably, that rectifier diode which forms with its first service terminal an anode is connected to the reference potential and is constructed as a p-Schottky diode on a p-conducting semiconductor substrate. Alternatively, that rectifier diode can be connected with its first service terminal forming a cathode to the reference potential whereby the rectifier is constructed as an n-Schottky diode on an n-conducting semiconductor substrate. A similar reduction in the parasitic impedance can be achieved by constructing or realizing the rectifier in a Greinacher circuit which also may have a single stage or a multi-stage construction. Preferably, the rectifier diode which is constructed as a p-Schottky diode on a p-conducting semiconductor substrate, is connected with its first service terminal forming an anode to the reference potential and/or that rectifier diode which is connected with its second service terminal forming a cathode, to an output of the rectifier circuit, whereby the rectifier diode is constructed as an n-Schottky diode on a p-conducting semiconductor substrate. In yet another embodiment that semiconductor diode which forms with its first service terminal an anode that is connected to the reference potential, can be formed as a p-Schottky diode on an n-conducting semiconductor substrate and/or that semiconductor diode which forms with its second service terminal a cathode and is connected to the output voltage of the rectifier, can be formed as a p-Schottky diode on an n-conducting semiconductor substrate.

According to the invention the parasitic characteristics of the semiconductor diodes can be reduced by encircling or surrounding the semiconductor diode or diodes with a conductor path structure that is spaced from the respective diode or diodes with a small or minimal spacing and to connect that conductor path to the reference potential, particularly ground potential. It has been found that this feature further improves the Q factor by reducing the parasitic diode path.

BRIEF DESCRIPTION OF THE DRAWINGS

In order that the invention may be clearly understood, it will now be described in connection with example embodiments thereof, with reference to the accompanying drawings, wherein:

FIG. 7 is a circuit arrangement of a Greinacher circuit in a p-doped semiconductor substrate;

FIG. 8 is a circuit arrangement of a Greinacher circuit in an n-doped semiconductor substrate;

FIG. 9 is a schematic block circuit diagram of an integrated positioned around a diode circuit with a rectifier and a passive, back-scattering transponder; and FIG. 10 is a schematic plan view of a conductor path structure positioned around a diode for reducing parasitic characteristics of a Schottky diode.

DETAILED DESCRIPTION OF A PREFERRED EXAMPLE EMBODIMENT AND OF THE

BEST MODE OF THE INVENTION

FIGS. 1A to 4B illustrate different types of Schottky diodes that can be realized in or on a semiconductor substrate. Such Schottky-diodes can be used as a rectifier in the integrated transponder circuits according to the invention.

Figure 1A:
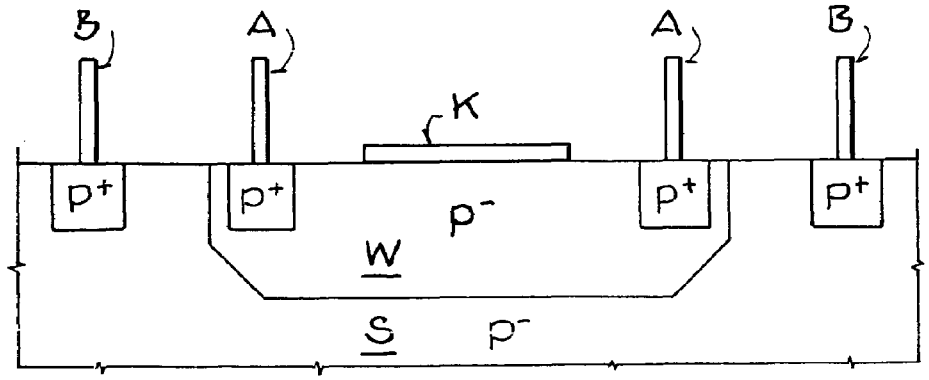
FIG. 1A is a schematic sectional view through a p-Schottky diode formed in a trough region of a p-doped semiconductor substrate.

FIG. 1A shows a schematic sectional view of a p-Schottky-diode formed in or on semiconductor substrate S which has a p-doped trough area W. A ring anode A is formed in the surface of the trough area W. The ring anode A forms a first service terminal in a margin or rim area of the p-doped trough area W. The configuration of the ring anode A can be circular, square, or rectangular or it may have any other suitable configuration. Alternatively the entire substrate S can be formed as a doped trough. A cathode K is formed as a second service terminal comprising a metal semiconductor transition inside the ring anode A on the surface of the trough area W. A ring shaped reference terminal B is implemented next to and outside of the doped trough area W on the surface of the semiconductor substrate S. The reference terminal B serves for connection to a reference potential, such as ground. The diode path is formed between the first service terminal A and the second service terminal K.

Figure 1B:
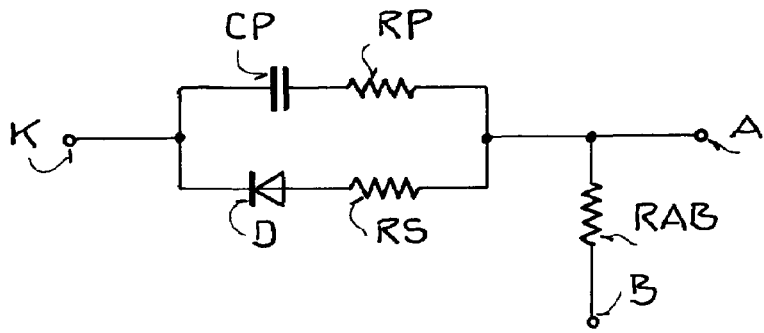
FIG. 1B is a schematic, simplified HF-equivalent circuit of the p-Schottky diode according to FIG. 1A.

FIG. 1B shows schematically a simplified HF-equivalent circuit of the p-Schottky diode constructed as shown in FIG. 1A. Inductive components are negligible due to the geometric dimensions of the diode elements. A resistance RS is connected in series with a diode D between the anode A and the cathode K. The diode D represents the actual diode path.

A series connection of a resistor RP and a capacitor CP is connected in parallel to the series connection of the diode and the series resistor RS. The resistor RP and the capacitor CP represent so-called barrier layer or depletion layer parasites. The parasitic impedance between the reference terminal B and the anode A which forms the first service terminal, is represented by a resistor RAB. This parasitic impedance RAB which is the so-called trough parasite, is primarily caused by effects between the trough area W and the semiconductor substrate S surrounding the trough area W.

Figure 2A:
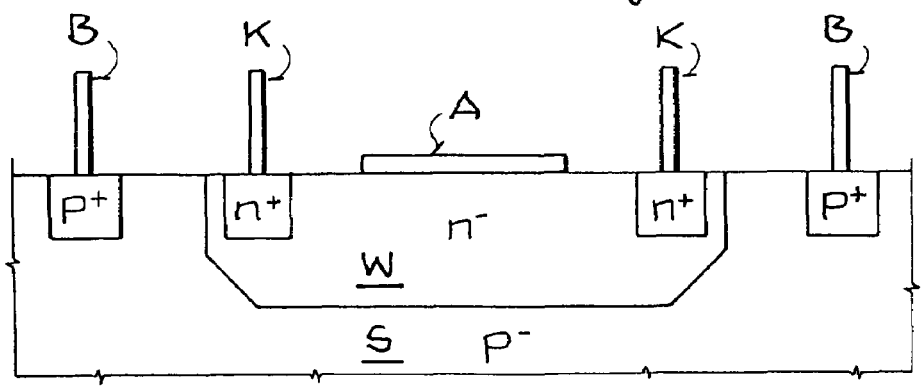
FIG. 2A is a schematic sectional view of an n-Schottky diode in a p-doped trough region of a semiconductor substrate.

FIG. 2A shows a schematic sectional view of an n-Schottky diode in a p-doped semiconductor substrate S. Except for the doping, the illustration of FIG. 2A corresponds to that of FIG. 1A. As a result of this different doping, the anode and the cathode are exchanged compared to what is shown in FIG. 1A. In this embodiment the first ring-shaped service terminal in the margin or rim area of the trough W is the cathode K while the second service terminal is the anode A.

Figure 2B:
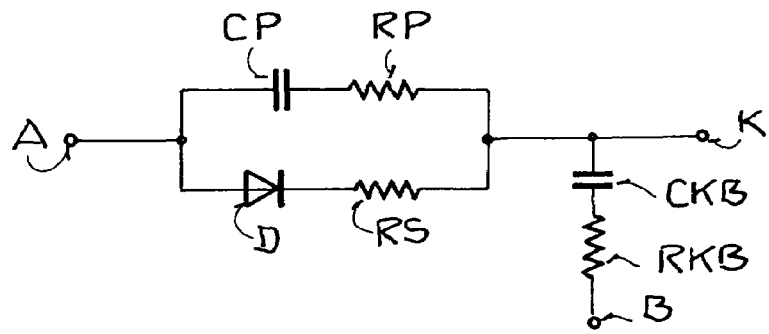
FIG. 2B is a schematic, simplified HF-equivalent circuit of the n-Schottky diode according to FIG. 2A.

FIG. 2B shows a schematic simplified HF-equivalent circuit of the n-Schottky diode of FIG. 2A. Compared to FIG. 1B the anode A and cathode K are exchanged. Further, the parasitic impedance RAB of FIG. 1B is replaced by a series connection of a parasitic capacitor CKB connected in series with a parasitic resistor RKB. The series connection of the resistor RKB with the capacitor CKB connects the cathode K to the reference terminal B.

Figure 3A:
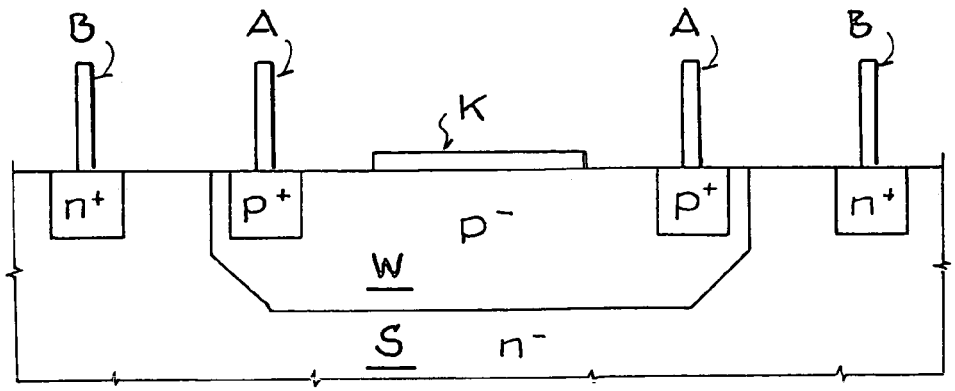
FIG. 3A is a schematic sectional view of a p-Schottky diode in an n-doped trough region of a semiconductor substrate.
Figure 3B:
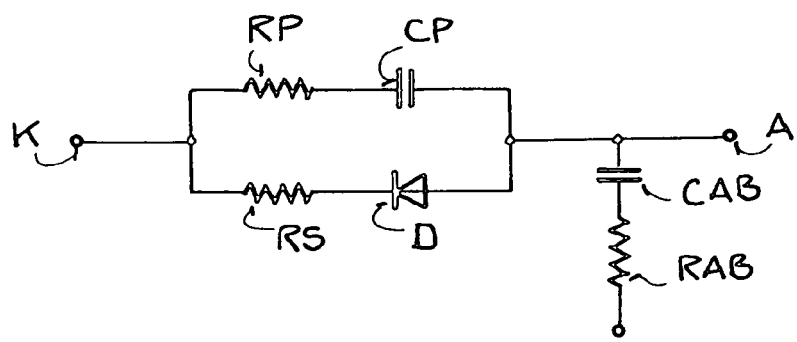
FIG. 3B is a schematic simplified HF-equivalent circuit of the p-Schottky diode according to FIG. 3A.

FIG. 3A shows a schematic sectional view through a p-Schottky diode in an n-doped semiconductor substrate S, while FIG. 3B illustrates the corresponding HF-equivalent circuit. The difference to FIG. 1A is the fact that the substrate S is n-doped, whereby the parasitic impedance between the anode A and the reference terminal B comprises an additional capacitive component which is shown as a capacitor CAB. The first service terminal in this embodiment is the anode A while the second service terminal is the cathode K.

Figure 4A:
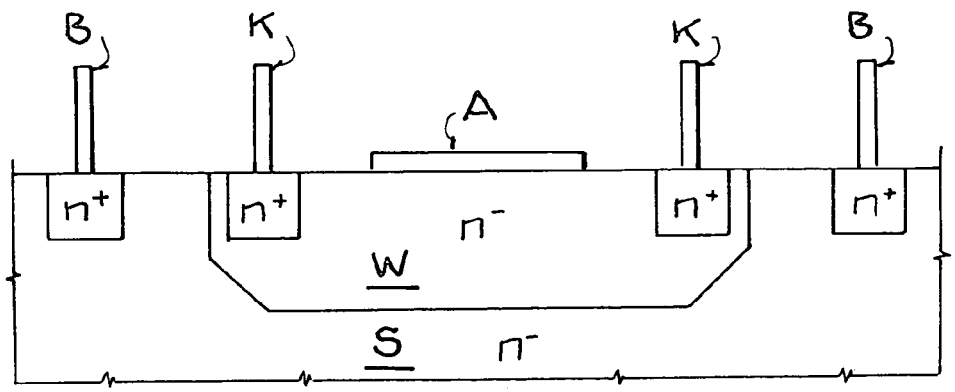
FIG. 4A is a schematic sectional view of an n-Schottky diode in an n-doped trough region of a semiconductor substrate.
Figure 4B:
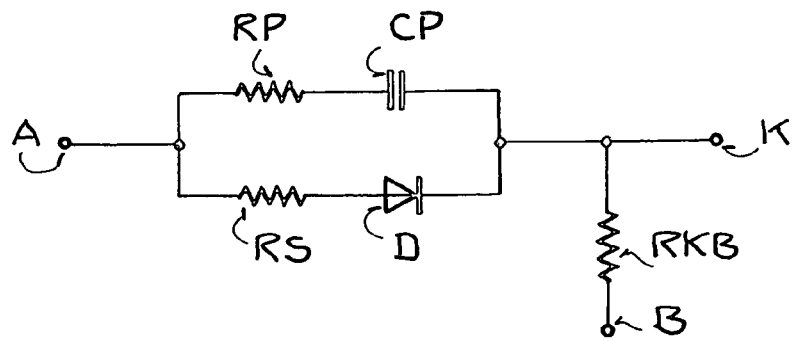
FIG. 4B is a schematic simplified HF-equivalent circuit of the n-Schottky diode according to FIG. 1A.

FIG. 4A shows a schematic sectional view of an n-Schottky diode in an n-doped semiconductor substrate while FIG. 4B illustrates the respective HF-equivalent circuit. Compared to FIG. 2A the substrate is n-doped, whereby a parasitic impedance shown as the resistor RKB is formed between the cathode K and the reference terminal B. The first service terminal in this embodiment is the cathode K while the second service terminal is the anode A.

Figure 5A:
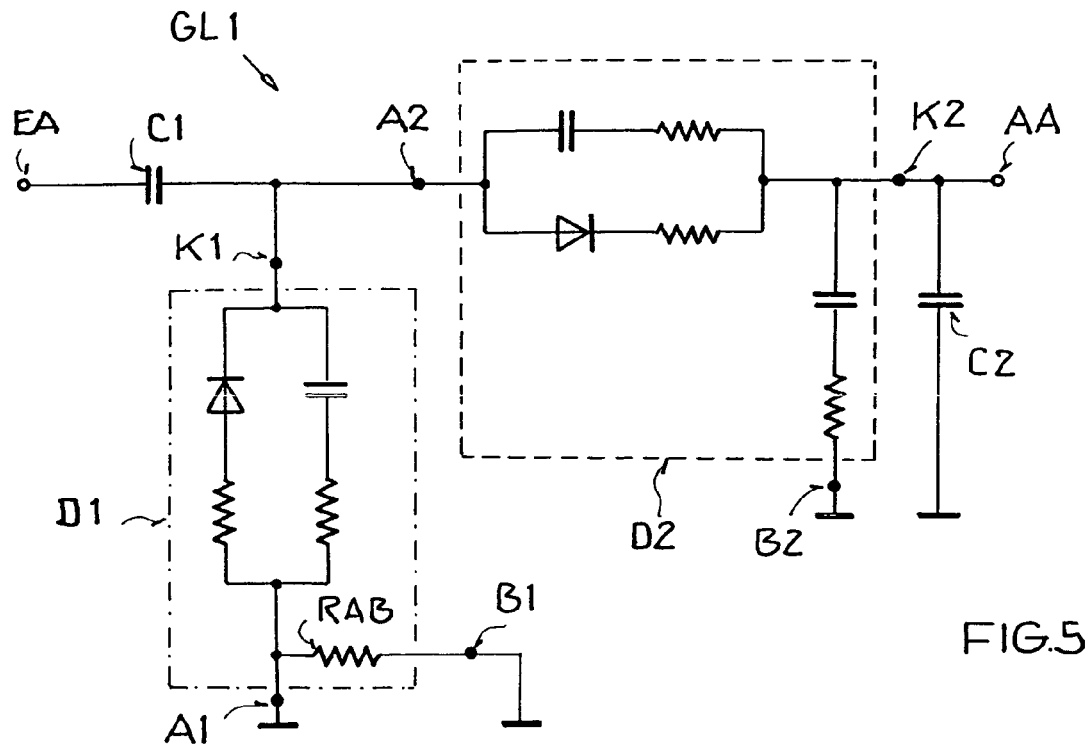
FIG. 5A is a circuit arrangement of a Villard circuit with a p-doped semiconductor substrate according to a first embodiment.

FIG. 5A shows a rectifier GL1 assembled as a Villard circuit which has been realized in this first embodiment in a p-doped semiconductor substrate. An antenna, not shown, is connected between a ground reference potential and an input terminal EA. An operating voltage is tapped off between an output terminal AA and the ground reference potential. A capacitor C1 and a diode D2 are connected in series with each other and the series connection is connected between the input terminal EA and the output terminal AA. The diode D2 is constructed as an n-Schottky diode in accordance with the illustration of FIG. 2A. The HF-equivalent circuit of the diode D2 is shown in FIG. 2B. A cathode terminal K2 of the diode D2 is connected with the output terminal AA. A capacitor C2 connects the output terminal AA to the ground reference potential. An anode terminal A2 of the diode D2 is connected with the cathode terminal K1 of a diode D1 and with the capacitor C1. The diode D1 is constructed as a p-Schottky diode in accordance with FIG. 1A and illustrated in its HF-equivalent circuit according to FIG. 1B. The anode terminal A1 of the diode D1, namely its first service terminal, is connected with its reference terminal B1 to ground, whereby the parasitic impedance RAB of the diode D1 is short circuited, thereby increasing or noticeably improving the efficiency of the rectifier GL1.

Figure 5B:
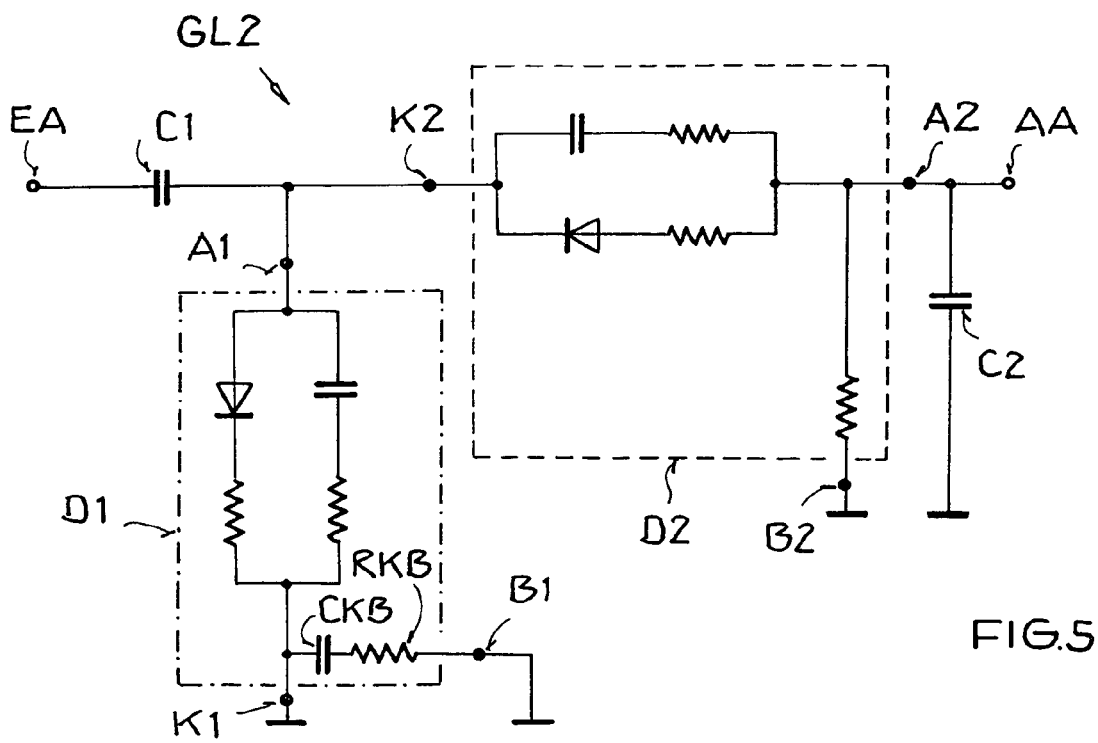
FIG. 5B is as circuit arrangement of a Villard circuit in a p-doped semiconductor substrate according to a second embodiment.

FIG. 5B shows a circuit arrangement of a rectifier GL2 in a second Villard circuit embodiment. This rectifier can also be realized in a p-doped semiconductor substrate illustrating a second embodiment. The difference compared to FIG. 5A is the fact that the diode D1 is constructed as an n-Schottky diode according to FIG. 2A and the diode D2 is constructed as a p-Schottky diode according to FIG. 1A. A further difference resides in that the forward direction of the diodes D1 and D2 is inverted. The anode terminal A2 of the diode D2 is connected with the output terminal AA. The cathode terminal K2 of the diode B2 is connected with the anode terminal A1 of the diode B2 and with the capacitor C1. This rectifier circuit arrangement GL2 produces a negative supply voltage at its output terminal AA. In this embodiment the parasitic impedance formed by the capacitor CKB and the resistor RKB is short-circuited because the cathode terminal K1 of the diode D1, that is its first service terminal, as well as its reference terminal B1, are connected to ground. As a result, the efficiency of the rectifier GL2 has been noticeably improved.

Figure 6A:
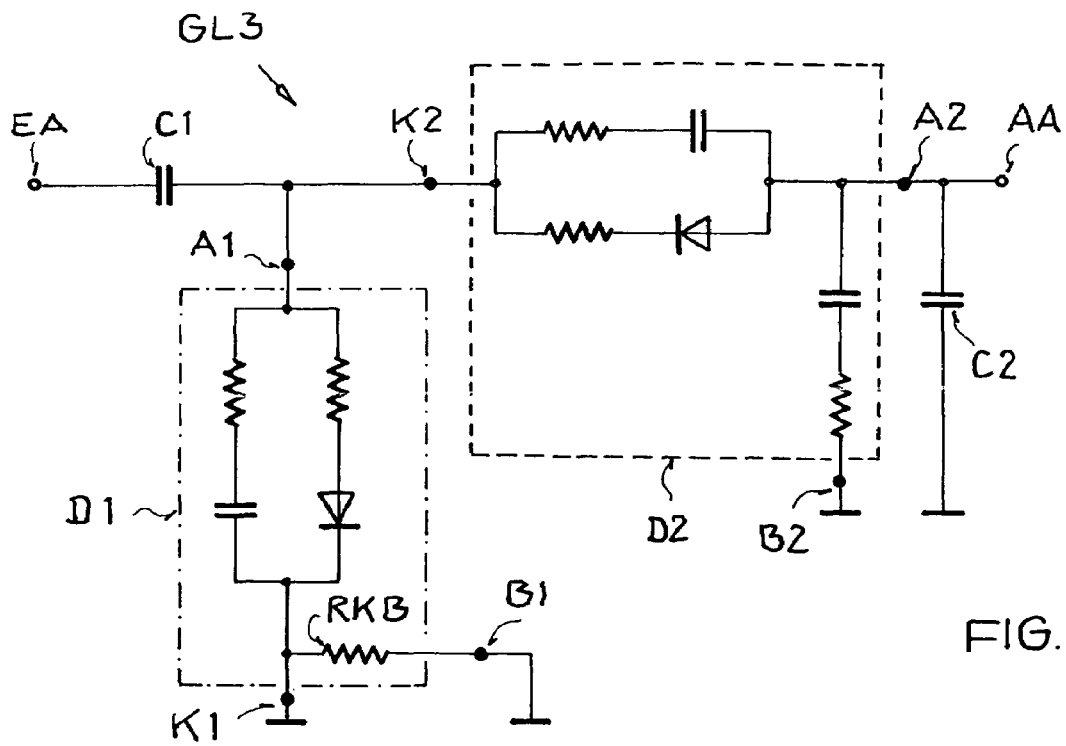
FIG. 6A is a circuit arrangement of a Villard circuit in an n-doped semiconductor substrate according to a third embodiment.

FIG. 6 shows a further embodiment of a Villard circuit illustrating a rectifier GL3 in an n-dotted semiconductor substrate. In this circuit the diode D1 is constructed as an n-Schottky diode in accordance with FIG. 4A and the diode D2 is constructed as a p-Schottky diode in accordance with FIG. 3A. The rectifier GL3 produces a negative supply voltage at its output AA. The parasitic impedance RKB of the diode D1 is short-circuited because the cathode terminal K1 of the diode D1, that is its first service terminal, and its reference terminal B1 are connected to ground. As a result, the efficiency of the rectifier G13 is significantly improved.

Figure 6B:
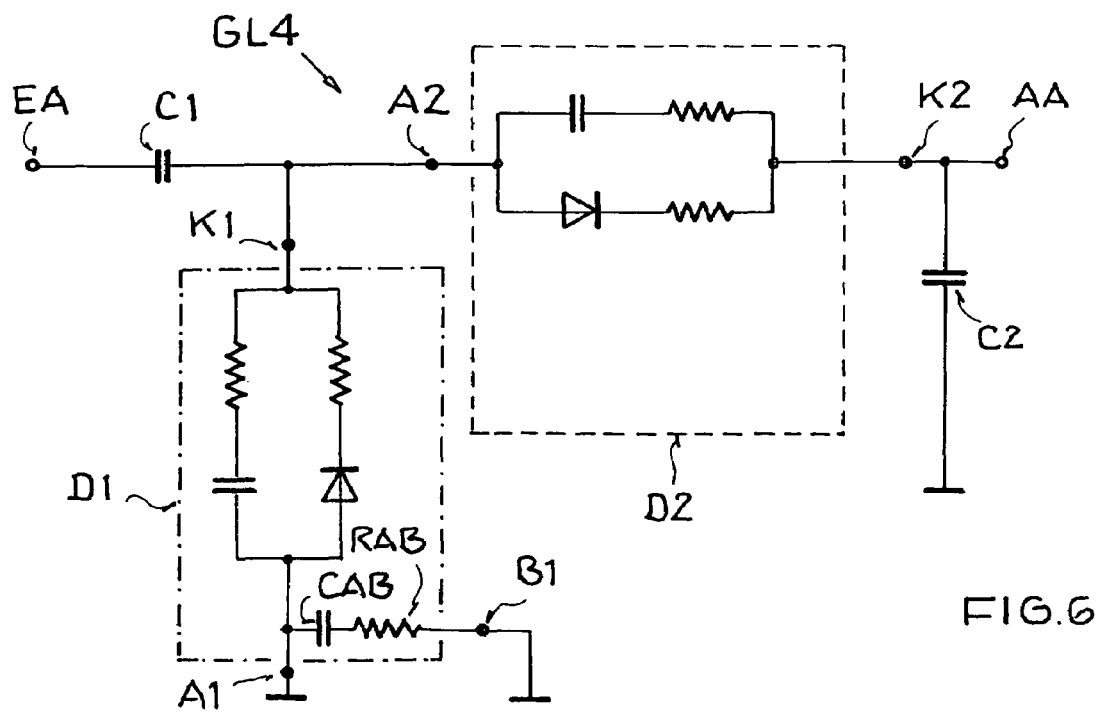
FIG. 6B is a circuit arrangement of a Villard circuit in an n-doped semiconductor substrate according to a fourth embodiment.

FIG. 6B shows a circuit arrangement of a rectifier G14 in a further Villard circuit embodiment comprising an n-doped semiconductor substrate in which the diodes D1 and D2 are constructed as p-Schottky diodes in accordance with FIG. 3A. The anode terminal A1 of the diode D1, which constitutes its first service terminal, is connected to ground. Similarly, the reference terminal B1 is also connected to ground. As a result the parasitic impedance comprising the capacitor CAB and the resistor RAB are short-circuited, whereby the efficiency of the rectifier GL4 is also significantly improved.

FIG. 7 shows a rectifier circuit GL5 in a Greinacher circuit embodiment with a p-dotted semiconductor substrate. An antenna, not shown, is connected to the input terminals EA1 and EA2. An operating voltage is tapped off between one output terminal AA and a ground reference potential. A diode D2 is connected between the first input EA1 and the output AA. The diode D2 is constructed as an n-Schottky diode according to FIG. 2A as illustrated in its HF-equivalent circuit diagram shown in FIG. 2B. The cathode terminal K2 of the diode D2 is connected with the output terminal AA. The anode terminal A2 of the diode D2 is connected to the first input EA1. The cathode terminal K2 of the diode D2 is connected with the output terminal AA. A capacitor C3 connects the cathode K2 and thus the output terminal AA with the second input EA2. A further capacitor C4 is connected on the one hand to the second input terminal EA2 and on the other hand to the ground reference potential. An anode terminal A2 of the diode D2 is connected with a cathode terminal K1 of a diode D1 and with the first input terminal EA1. The diode D1 is a p-Schottky diode according to FIG. 1A and as illustrated in its HF-equivalent circuit according to FIG. 1B. The anode terminal A1, namely the first service terminal of the first diode D1, is connected to ground. Similarly; the reference terminal B1 is connected to ground. As a result, the parasitic impedance RAB of the diode D1 is short-circuited, whereby the efficiency of the rectifier GL5 is significantly improved.

FIG. 8 shows a further embodiment of a rectifier GL2 in a Greinacher circuit embodiment with an n-doped semiconductor substrate including two diodes D1 and D2 which are constructed as p-Schottky diodes according to FIG. 3A. The anode terminal A1 of the diode D1, namely its first service terminal, is connected to ground. Similarly, the reference terminal B1 is connected to ground. As a result, the parasitic impedance of the diode D1 comprising the resistor RAB and the capacitor CAB which are connected in series with each other, are short-circuited, whereby the efficiency of the rectifier GL6 is also significantly improved.

The illustrated rectifiers GL1, GL2, GL3, GL4, GL5 and GL6 can be used for producing a supply voltage. However, these rectifiers are also suitable for use in a detector circuit or as so-called receiver signal strength indicators (RSSI) for the detection of voltage breakdowns in connection with a carrier wave. The illustrated diodes can also be assembled as a parallel circuit comprising a plurality of diodes.

It is a common feature to all embodiments of the invention that the parasitic components of the rectifiers GL1 to GL6 are minimized in that the service terminal of the rectifier diodes which comprises a parasitic impedance relative to the reference terminal, is maintained at the reference potential, more specifically is connected to the reference potential, such as ground. This feature of the invention increases the attainable transmission range for the data transmission between a base station and the transponder equipped with the present rectifiers.

FIG. 9 shows schematically a block circuit diagram of an integrated circuit in the form of a transponder integrated circuit TRIC with a rectifier GL constructed as described above and shown in FIGS. 5A to FIG. 8 and an evaluating circuit AS. The evaluating circuit AS may, for example comprise a so-called status engine and analog circuit units. The transponder TRIC or the evaluating circuit AS realizes a passive back-scattering transponder. An antenna not shown is connected to the input terminals EA1 and EA2 of the rectifier GL. The antenna gathers the power required for operating the transponder integrated circuit TRIC from an electromagnetic field that is emitted by a base station not shown. The rectifier GL produces an operating voltage which serves as supply voltage to the transponder TRIC and the evaluating circuit AS thereof, respectively.

FIG. 10 shows a schematic plan view of a conductor path structure LB for reducing parasitic characteristics of a Schottky diode SD. The conductor path structure LB is formed as a ring-shaped conductor path which is positioned with a minimal spacing all around the respective Schottky diode SD. The conductor path structure LB is connected to the ground reference potential. When the Schottky diode SD is constructed in accordance with the present FIGS. 1A to 4A, the conductor path structure LB can be arranged on the surface of the semiconductor substrate S in such a way that the conductor path structure surrounds the reference terminal B. It has been found that the conductor path structure LB improves the quality Q of the parasitic diode path. Any of the Schottky diodes as used in the rectifiers illustrated in FIGS. 5A to 8 can selectively be surrounded by such a conductor path structure LB. In other words, one or more Schottky diodes may be equipped with such a conductor path structure that is maintained at the reference potential.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An integrated circuit comprising a transponder, a rectifier connected to said transponder, said rectifier comprising rectifier diodes (D1, D2), each of said rectifier diodes comprising a reference terminal for connection to a reference potential, a first service terminal and a second service terminal, a diode path between said first and second service terminals, a parasitic impedance between said first service terminal and said reference terminal, and an electrical connection between said reference potential and said first service terminal of at least one rectifier diode of said rectifier diodes for reducing said parasitic impedance.

2. The integrated circuit of claim 1, wherein said reference potential is ground potential, and wherein said first service terminal of said at least one rectifier diode is connected to said ground potential.

3. The integrated circuit of claim 1, further comprising a semiconductor substrate, at least one doped trough region in said semiconductor substrate for forming Schottky-diodes for serving as said rectifier diodes, said first and second service terminals being formed on said at least one doped trough region at a spacing from each other, and wherein said reference terminal is formed on a surface area of said semiconductor substrate next to said at least one doped trough region.

4. The integrated circuit of claim 1, wherein said rectifier is constructed as a Villard-circuit.

5. The integrated circuit of claim 1, further comprising a p-conducting semiconductor substrate, and wherein one of said rectifier diodes having its first service terminal forming an anode connected to said reference potential, is constructed as a p-Schottky-diode on said p-conducting semiconductor substrate.

6. The integrated circuit of claim 1, further comprising an n-conducting semiconductor substrate, and wherein one of said rectifier diodes having its first service terminal forming a cathode connected to said reference potential, is constructed as an n-Schottky-diode on said n-conducting semiconductor substrate.

7. The integrated circuit of claim 1, wherein said rectifier is constructed as a Greinacher-circuit.

8. The integrated circuit of claim 7, further comprising a p-conducting semiconductor substrate, wherein said rectifier diodes comprise a first rectifier diode and a second rectifier diode, wherein said first rectifier diode (D1) having its first service terminal forming an anode connected to said reference potential is constructed as a p-Schottky-diode on said p-conducting semiconductor substrate, and wherein said second rectifier diode (D2) having its second service terminal forming a cathode connected to an output (AA) of the rectifier is constructed as an n-Schottky-diode on said p-conducting semiconductor substrate.

9. The integrated circuit of claim 7, further comprising a p-conducting semiconductor substrate, wherein said rectifier comprises a diode having its second service terminal forming a cathode connected to an output (AA) of the rectifier is constructed as an n-Schottky-diode on said p-conducting semiconductor substrate.

10. The integrated circuit of claim 7, further comprising an n-conducting semiconductor substrate, wherein said rectifier diodes comprise a first rectifier diode and a second rectifier diode, wherein said first rectifier diode (D1) having its first service terminal forming an anode connected to said reference potential is constructed as a p-Schottky-diode on said n-conducting semiconductor substrate, and wherein said second rectifier diode (D2) having its second service terminal forming a cathode connected to an output (AA) of the rectifier is constructed as a p-Schottky-diode on said n-conducting semiconductor substrate.

11. The integrated circuit of claim 7, wherein said rectifier comprises a diode having its second service terminal forming a cathode connected to an output (AA) of the rectifier is constructed as a p-Schottky-diode on said n-conducting semiconductor substrate.

12. The integrated circuit of claim 1, further comprising at least one conductor path positioned around said rectifier diode, said at least one conductor path being connected to said reference potential for reducing parasitic characteristics of said rectifier diode.

13. The integrated circuit of claim 12, wherein a spacing between said at least one conductor path and said rectifier diode is minimized.

14. The integrated circuit of claim 12, wherein at least one conductor path surrounds each of said rectifier diodes.

15. The integrated circuit of claim 12, wherein said at least one conductor path surrounds a plurality of said rectifier diodes.

16. The integrated circuit of claim 1, wherein said transponder is constructed as one of a passive transponder, a semi-passive transponder and a back-scattering transponder.

17. The integrated circuit of claim 1, wherein said rectifier functions as a voltage supply source for said transponder.

18. The integrated circuit of claim 1, wherein said rectifier functions as a detector circuit for said transponder.

19. The integrated circuit of claim 18, wherein said detector circuit is an RSSI-circuit.

20. The integrated circuit of claim 1, wherein said second service terminal is constructed as a metal-semiconductor transition.

21. The integrated circuit of claim 1, further comprising a substrate having a margin area, and wherein said first and second service terminals are positioned in said margin area at a spacing from each other.

* * * * *